United States Patent
Kawai

(10) Patent No.: US 7,002,639 B2
(45) Date of Patent: Feb. 21, 2006

(54) DUAL DIGITAL TELEVISION TUNER

(75) Inventor: Satoshi Kawai, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 541 days.

(21) Appl. No.: 10/108,592

(22) Filed: Mar. 27, 2002

(65) Prior Publication Data

US 2002/0140872 A1    Oct. 3, 2002

(30) Foreign Application Priority Data

Mar. 30, 2001  (JP) ................. 2001-098859

(51) Int. Cl.
  *H04N 5/44* (2006.01)
  *H04N 5/50* (2006.01)
(52) U.S. Cl. ............ 348/731; 348/732; 348/725; 455/191.1; 455/209
(58) Field of Classification Search ............ 348/731, 348/732, 725, 729, 733, 723, 607, 470; 455/191.1, 455/178.1, 179.1, 180.1, 180.3, 189.1, 196.1, 455/209, 222; 334/1, 3, 87; 375/307, 323, 375/329, 335, 346
See application file for complete search history.

(56) References Cited

U.S. PATENT DOCUMENTS

| | | | |
|---|---|---|---|
| 4,856,085 A * | 8/1989 | Horvat | 455/315 |
| 5,003,397 A * | 3/1991 | Wink | 348/735 |
| 5,140,198 A * | 8/1992 | Atherly et al. | 327/113 |
| 5,285,284 A | 2/1994 | Takashima et al. | |
| 5,311,318 A * | 5/1994 | Dobrovolny | 348/731 |
| 5,517,685 A * | 5/1996 | Aoyama et al. | 455/260 |
| 6,008,693 A * | 12/1999 | Heinke | 329/325 |
| 6,151,488 A * | 11/2000 | Brekelmans | 455/150.1 |
| 6,175,726 B1 * | 1/2001 | Sydon | 455/209 |
| 6,393,299 B1 * | 5/2002 | Mizumoto et al. | 455/552.1 |
| 6,760,577 B1 * | 7/2004 | Li | 455/323 |
| 6,768,902 B1 * | 7/2004 | Kajita | 455/313 |

FOREIGN PATENT DOCUMENTS

| | | |
|---|---|---|
| JP | 63067030 A | 3/1988 |
| JP | 8-237156 | 9/1996 |
| JP | 8-289212 | 11/1996 |
| WO | WO 9832233 | 7/1998 |

* cited by examiner

Primary Examiner—John Miller
Assistant Examiner—Jean W. Désir
(74) Attorney, Agent, or Firm—Brinks Hofer Gilson & Lione

(57) ABSTRACT

A dual digital television tuner includes first and second direct conversion circuits, each having a pair of mixers and a local oscillator, in which a digital television signal is input to the pair of mixers, which directly output baseband signals. The first direct conversion circuit may have a frequency divider or a multiplier. Each of the pair of mixers, the local oscillator, the frequency divider, and the multiplier is constituted by a balanced circuit. An oscillation signal of the local oscillator in the first direct conversion circuit is input to the pair of mixers of the first direct conversion circuit through the frequency divider or the multiplier.

42 Claims, 3 Drawing Sheets

DUAL DIGITAL TELEVISION TUNER

BACKGROUND OF THE INVENTION

1. Field of the Invention

The present invention relates to a dual digital television tuner having two systems.

2. Description of the Related Art

FIG. 4 shows the configuration of a known dual digital television tuner. A digital television intermediate-frequency signal (IF), which is generated by frequency-conversion by an outside downconverter (not shown), is separated and distributed by a distributor 51, and one separated intermediate-frequency signal is input to a first direct conversion circuit 52. The first direct conversion circuit 52 includes a first intermediate-frequency amplifier 53 to which the one separated intermediate-frequency signal is input, a first variable gain amplifier 54 provided in the next stage, a pair of first mixers 55 and 56 provided in the next stage, a first local oscillator 57 for generating a local oscillation signal, a first phase shifter 58 for dividing the local oscillation signal into two phases orthogonal to each other and for inputting the phases to the mixers 55 and 56, and a pair of first baseband signal amplifiers 59 and 60 provided in the stage after the mixers 55 and 56.

Outside the first direct conversion circuit 52, a first PLL circuit 61 for controlling the oscillation frequency of the first local oscillator 57, a first demodulator 62 for demodulating baseband signals (I/Q), and so forth are provided.

On the other hand, the other separated intermediate-frequency signal output from the distributor 51 is input to a second direct conversion circuit 63. The second direct conversion circuit 63 includes a second intermediate-frequency amplifier 64 to which the other intermediate-frequency signal is input, a second variable gain amplifier 65 provided in the next stage, a pair of second mixers 66 and 67 provided in the next stage, a second local oscillator 68 for generating a local oscillation signal, a second phase shifter 69 for dividing the local oscillation signal into two phases orthogonal to each other and for inputting the phases to the mixers 66 and 67, and a pair of second baseband signal amplifiers 70 and 71 provided in the stage after the mixers 66 and 67.

Outside the second direct conversion circuit 63, a second PLL circuit 72 for controlling the oscillation frequency of the second local oscillator 68, a second demodulator 73 for demodulating baseband signals (I/Q), and so forth are provided.

The local oscillators 57 and 68 are controlled so that they oscillate at substantially the same frequency as the intermediate frequency of the channel that each of the direct conversion circuits 52 and 63 should receive. In the first direct conversion circuit 52, the pair of mixers 55 and 56 receive local oscillation signals whose phases are orthogonal to each other, and thus the baseband signal amplifiers 59 and 60 output baseband signals which are orthogonal to each other.

Likewise, in the second direct conversion circuit 63, the pair of mixers 66 and 67 receive local oscillation signals whose phases are orthogonal to each other, and thus the baseband signal amplifiers 70 and 71 output baseband signals which are orthogonal to each other.

The baseband signals are added and demodulated in the demodulators 62 and 73, respectively, converted to an analog signal, and converted to a picture signal or the like.

In the above-described configuration, when the first direct conversion circuit 52 and the second direct conversion circuit 63 receive intermediate-frequency signals of the same channel, the oscillation frequency of the first local oscillator 57 is the same as that of the second local oscillator 68. Thus, mutual interference between the local oscillation signals causes beating (which is due to a slight difference that exists between the local oscillation signals), leading to a deterioration of the phase noise of the local oscillation signals and degradation of the reception characteristics.

SUMMARY OF THE INVENTION

Accordingly, it is an object of the present invention to provide a dual digital television tuner in which interference between two local oscillation signals can be prevented so that phase noise is reduced.

To solve the above-described problems, according to a first aspect of the present invention, a dual digital television tuner comprises first and second direct conversion circuits, each having a pair of mixers and a local oscillator, in which a digital television signal is input to the pair of mixers, which directly output baseband signals. The first direct conversion circuit comprises one of a frequency divider and a multiplier. Each of the pair of mixers, the local oscillator, the frequency divider, and the multiplier is constituted by a balanced circuit. An oscillation signal of the local oscillator in the first direct conversion circuit is input to the pair of mixers of the first direct conversion circuit through the frequency divider or the multiplier.

Accordingly, the difference between the oscillation frequency of the local oscillator of the first direct conversion circuit and that of the local oscillator of the second direct conversion circuit becomes greater and thus interference between the oscillation signals is reduced. Further, even when the frequency of the local oscillation signal input to the pair of mixers of the first direct conversion circuit is the same as that of the local oscillation signal input to the pair of mixers of the second direct conversion circuit, the level of each radiated local oscillation signal is lowered by phase cancellation and the interference can be prevented because both pairs of the mixers are constituted by balanced circuits.

According to a second aspect of the present invention, a dual digital television tuner comprises first and second direct conversion circuits, each having a pair of mixers and a local oscillator, in which a digital television signal is input to the pair of mixers, which directly output baseband signals. The first direct conversion circuit comprises a frequency divider and the second direct conversion circuit comprises a multiplier. Each of the pair of mixers, the local oscillator, the frequency divider, and the multiplier is constituted by a balanced circuit. An oscillation signal of the local oscillator in the first direct conversion circuit is input to the pair of mixers of the first direct conversion circuit through the frequency divider, and an oscillation signal of the local oscillator in the second direct conversion circuit is input to the pair of mixers of the second direct conversion circuit through the multiplier.

Accordingly, the difference in the frequency of the oscillation signals of the local oscillators becomes greater and mutual interference can be further reduced.

Preferably, the oscillation frequency band of the local oscillator in the first direct conversion circuit does not overlap the oscillation frequency band of the local oscillator in the second direct conversion circuit.

With this arrangement, direct interference between the oscillation signals can be prevented.

Also, the first direct conversion circuit and the second direct conversion circuit may be integrated.

Accordingly, both pairs of signal input terminals or both pairs of signal output terminals of both pairs of mixers become physically closer to each other and thus radiated local oscillation signals are more likely to be phase-cancelled.

DESCRIPTION OF THE PREFERRED EMBODIMENTS

Figure 1:
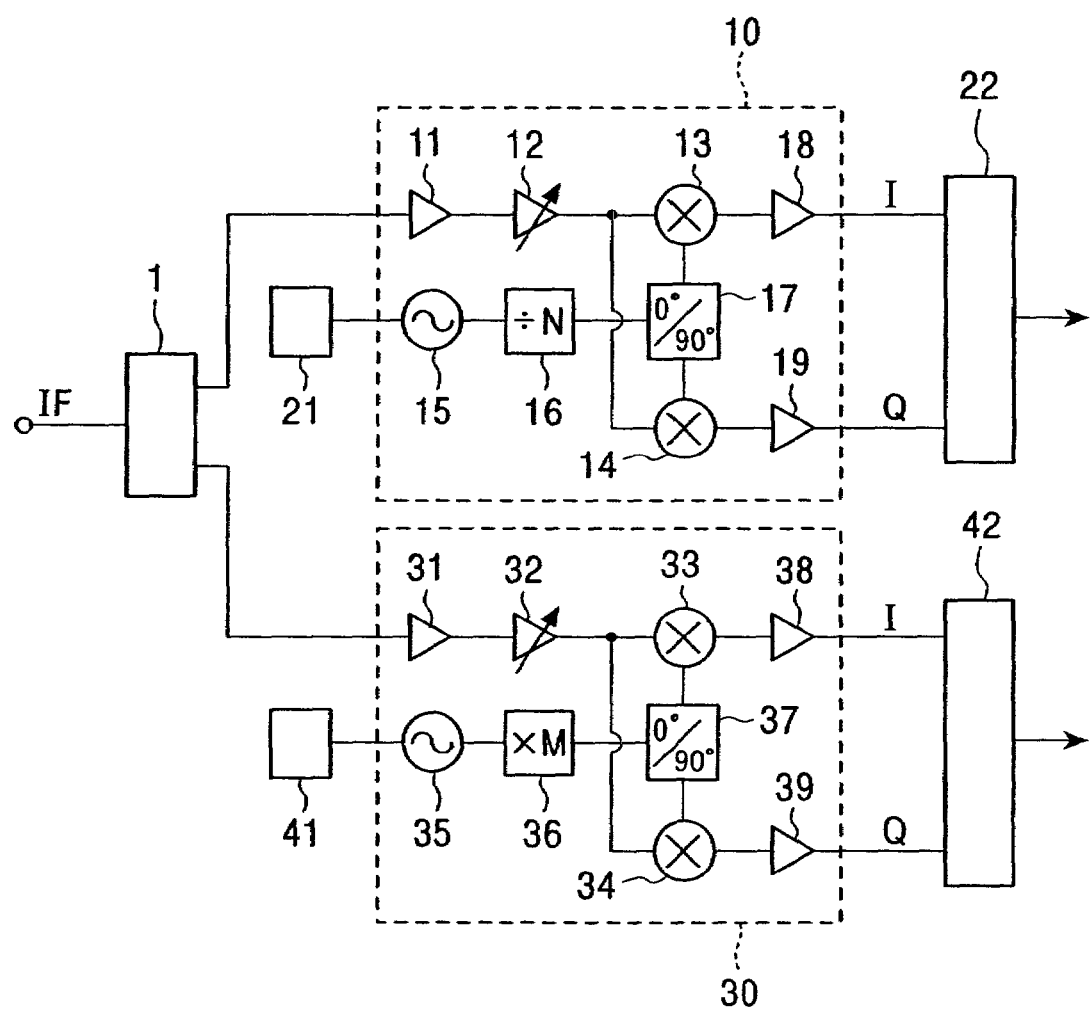
FIG. 1 is a circuit diagram showing the configuration of a dual digital television tuner according to the present invention.

Hereinafter, a dual digital television tuner according to the present invention is described with reference to the accompanying drawings. FIG. 1 is a circuit diagram showing an embodiment. A digital television intermediate-frequency signal (IF, see first frequency band A in FIG. 2) of about 950 MHz to 2150 MHz, which is generated by frequency-conversion by an outside downconverter (not shown), is separated and distributed by a distributor 1, and a first separated intermediate-frequency signal is provided to an input of a first direct conversion circuit 10.

The first direct conversion circuit 10 is integrated and includes a first intermediate-frequency amplifier 11, a first variable gain amplifier 12, a pair of first mixers 13 and 14, a first local oscillator 15, a frequency divider 16, a first phase shifter 17, and a pair of first baseband signal amplifiers 18 and 19.

The first intermediate-frequency amplifier 11 receives and amplifies the first separated intermediate-frequency signal. The first variable gain amplifier 12 further amplifies the amplified first separated intermediate-frequency signal provided from the first intermediate-frequency amplifier 11. The first variable gain amplifier 12 is provided in the succeeding stage after the first intermediate-frequency amplifier 11. The gain of the first variable gain amplifier 12 is controlled by an AGC (automatic gain control) voltage.

The pair of first mixers 13 and 14 are provided in the succeeding stage after the first variable gain amplifier 12. The first mixers 13 and 14 receive the signals from the first variable gain amplifier 12 and from the first phase shifter 17. Baseband signals (I signal and Q signal) are provided from an output of the pair of first mixers 13 and 14.

The first local oscillator 15 provides an oscillation signal, which the frequency divider 16 receives. The frequency divider 16 divides the oscillation frequency of the first local oscillator 15 by 1/N (where N is an integer such as 2, for example).

The first phase shifter 17 divides the frequency-divided oscillation signal into two phases orthogonal to each other and transmits the phases as local oscillation signals to inputs of the mixers 13 and 14. The mixers 13 and 14 mix the local oscillation signals from the first phase shifter 17 and the amplified signal from the first variable gain amplifier 12. The pair of first baseband signal amplifiers 18 and 19 is provided in the stage after the mixers 13 and 14. The pair of first baseband signal amplifiers 18 and 19 amplify the mixed signals from the mixers 13 and 14.

Each of the first intermediate-frequency amplifier 11, the first variable gain amplifier 12, the pair of first mixers 13 and 14, the first local oscillator 15, the frequency divider 16, the first phase shifter 17, and the pair of first baseband signal amplifiers 18 and 19 is constituted by a balanced circuit.

Other circuit elements are provided outside the first direct conversion circuit 10. Examples of these circuit elements include a first PLL circuit 21 that controls the oscillation frequency of the first local oscillator 15 and a first demodulator 22 that demodulates the amplified baseband signals from the first baseband signal amplifiers 18 and 19. The first PLL circuit 21 and the first demodulator 22 are also constituted from balanced circuits.

In the configuration described above, a local oscillation signal having the same frequency as that of the channel to be received in the intermediate-frequency signal must be supplied to an input of the pair of first mixers 13 and 14 for direct conversion by the mixers 13 and 14. Therefore, since the division factor of the frequency divider 16 is N, the first PLL circuit 21 controls the oscillation frequency of the first local oscillator 15 to be N times the frequency of the intermediate-frequency signal. In the foregoing case, N is 2 and thus the oscillation frequency is about 1900 MHz to 4300 MHz (see second frequency band B in FIG. 2), i.e. double the digital television intermediate-frequency signal of about 950 MHz to 2150 MHz.

Also, baseband signals whose phases are orthogonal to each other are supplied from an output from the mixers 13 and 14.

A digital signal generated by demodulation is provided from an output of the first demodulator 22 and the digital signal is converted to an analog picture signal and an audio signal by a D/A converter (not shown).

On the other hand, a second separated intermediate-frequency signal output from the distributor 1 is supplied to an input of a second direct conversion circuit 30. The second direct conversion circuit 30 is also integrated and includes similar components as the first direct conversion circuit 10.

The second direct conversion circuit 30 contains a second intermediate-frequency amplifier 31 having an input to which the second separated intermediate-frequency signal is provided. The second intermediate-frequency amplifier 31 amplifies the second separated intermediate-frequency signal. A second variable gain amplifier 32 is provided in the stage succeeding the second intermediate-frequency amplifier 31. The second variable gain amplifier 32 further amplifies the amplified second separated intermediate-frequency signal provided from the second intermediate-frequency amplifier 31. An AGC voltage controls the gain of the second variable gain amplifier 32. The AGC voltage that controls the gain of the second variable gain amplifier 32 may be the same as the AGC voltage supplied to the first variable gain amplifier 12.

A pair of second mixers 33 and 34 are provided in the stage succeeding the second variable gain amplifier 32. The second mixers 33 and 34 receive the signals from the second variable gain amplifier 32 and from a second phase shifter 37. Baseband signals (I signal and Q signal) are provided from an output of the second mixers 33 and 34.

A second local oscillator 35 provides an oscillation signal, which a multiplier 36 receives. The multiplier 36 multiplies the oscillation frequency of the second local oscillator 35 by M (where M is an integer such as 2, for example). Thus, both the frequency multiplier 36 and divider 16 are frequency-shifters that shift the frequency of the respective local oscillator by a factor (for example, the divider 16 shifts the frequency by a factor 1/N that is less than 1).

A second phase shifter 37 divides the multiplied oscillation signal provided by the multiplier 36 into two phases which are orthogonal to each other. The second phase shifter 37 supplies the phases as local oscillation signals to inputs of the second mixers 33 and 34. The second mixers 33 and 34 mix the local oscillation signals from the second phase shifter 27 and the amplified signal from the second variable gain amplifier 32. A pair of second baseband signal amplifiers 38 and 39 is provided in the stage after the second mixers 33 and 34. The pair of second baseband signal amplifiers 38 and 39 amplify the mixed signals from the second mixers 33 and 34.

Each of the second intermediate-frequency amplifier 31, the second variable gain amplifier 32, the pair of second mixers 33 and 34, the second local oscillator 35, the multiplier 36, the second phase shifter 37, and the pair of second baseband signal amplifiers 38 and 39 is constituted by a balanced circuit.

Other circuit elements are provided outside the second direct conversion circuit 30. Examples of these circuit elements include a second PLL circuit 41 that controls the oscillation frequency of the second local oscillator 35 and a second demodulator 42 that demodulates the amplified baseband signals from the second baseband signal amplifiers 38 and 39. The second PLL circuit 41 and the second demodulator 42 are also constituted by balanced circuits.

In the configuration described above, a local oscillation signal having the same frequency as that of the channel to be received in the intermediate-frequency signal must be supplied to an input of the pair of second mixers 33 and 34 for direct conversion by the mixers 33 and 34. Therefore, since the multiplication factor of the multiplier 36 is M, the second PLL circuit 41 controls the oscillation frequency of the second local oscillator 35 to be 1/M times the frequency of the intermediate-frequency signal. In the foregoing case, M is 2 and thus the oscillation frequency is about 475 MHz to 1075 MHz (see third frequency band C in FIG. 2) i.e. one-half the digital television intermediate-frequency signal of about 950 MHz to 2150 MHz.

Also, baseband signals whose phases are orthogonal to each other are supplied from an output of the second mixers 33 and 34.

A digital signal generated by demodulation is supplied from an output of the second demodulator 42 and the digital signal is converted to an analog picture signal and an audio signal by the D/A converter (not shown).

Figure 2:
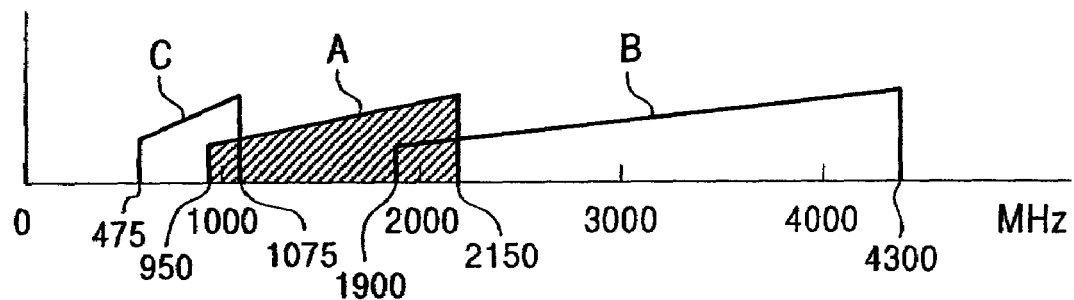
FIG. 2 is a frequency band diagram showing each range of local oscillation frequency in the dual digital television tuner according to the present invention.

In the above case, the oscillation frequency of the first local oscillator 15 and that of the second local oscillator 35 differ greatly, as is apparent from the comparison between the second frequency band B and the third frequency band C in FIG. 2, and the minimum difference is 825 MHz (=1900 MHz−1075 MHz). Accordingly, the oscillation frequency bands from the different local oscillators do not overlap each other and direct interference can be prevented.

The division factor N and the multiplication factor M are not limited to identical positive integers as described above, but in general they may be positive rational numbers. By adequately setting the numbers, the oscillation frequency band of the first local oscillator 15 does not overlap that of the second local oscillator 35. Similarly, the division factor N and the multiplication factor M are not limited to being the same factor. In one example, N may be 1.5 while M may be 2. Note that the different factors (M and N) may or may not be inverses of each other (i.e. M=1/N or M 1/N), as desired.

The above benefits will be provided if the frequencies of the local oscillators do not overlap. Thus, preferably the frequency ranges are separated. One preferable separation that ensures sufficient isolation is at least about 5% of the smaller frequency range. More preferably, separations that ensure sufficient isolation include at least about 10% or at least about 20% of the smaller frequency range.

When the first direct conversion circuit 10 and the second direct conversion circuit 30 receive the intermediate-frequency signal of the same channel, the frequency of the local oscillation signal input to the first mixers 13 and 14 is the same as the frequency of the local oscillation signal input to the second mixers 33 and 34. However, the region from the frequency divider 16 to the mixers 13 and 14 and the region from the multiplier 36 to the second mixers 33 and 34, where interference is likely to occur, are constituted by balanced circuits, and thus radiation of the local oscillation signal from each circuit can be suppressed and interference can be reduced.

The circuit is also naturally miniaturized by integration. In addition, by constructing each circuit configuration of the first mixers 13 and 14 and the second mixers 33 and 34 and so on by a balanced circuit, both pairs of signal input terminals and both pairs of signal output terminals thereof are physically closer to each other. Therefore, radiated balanced local oscillation signals are more likely to be phase-cancelled thus further reducing interference.

In the above case, the frequency divider 16 is provided in the first direct conversion circuit 10 and the multiplier 36 is provided in the second direct conversion circuit 30. However, the above-described advantages are not lost even when the frequency divider 16 of the first direct conversion circuit 10 or the multiplier 36 of the second direct conversion circuit 30 is removed and a frequency divider or a multiplier is provided in only one of the direct conversion circuits.

Figure 3:
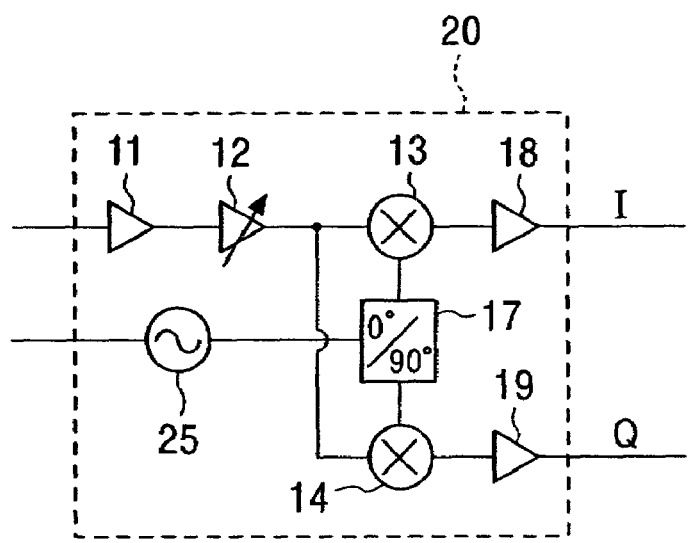
FIG. 3 is a circuit diagram showing another configuration of the dual digital television tuner according to the present invention.
Figure 4:
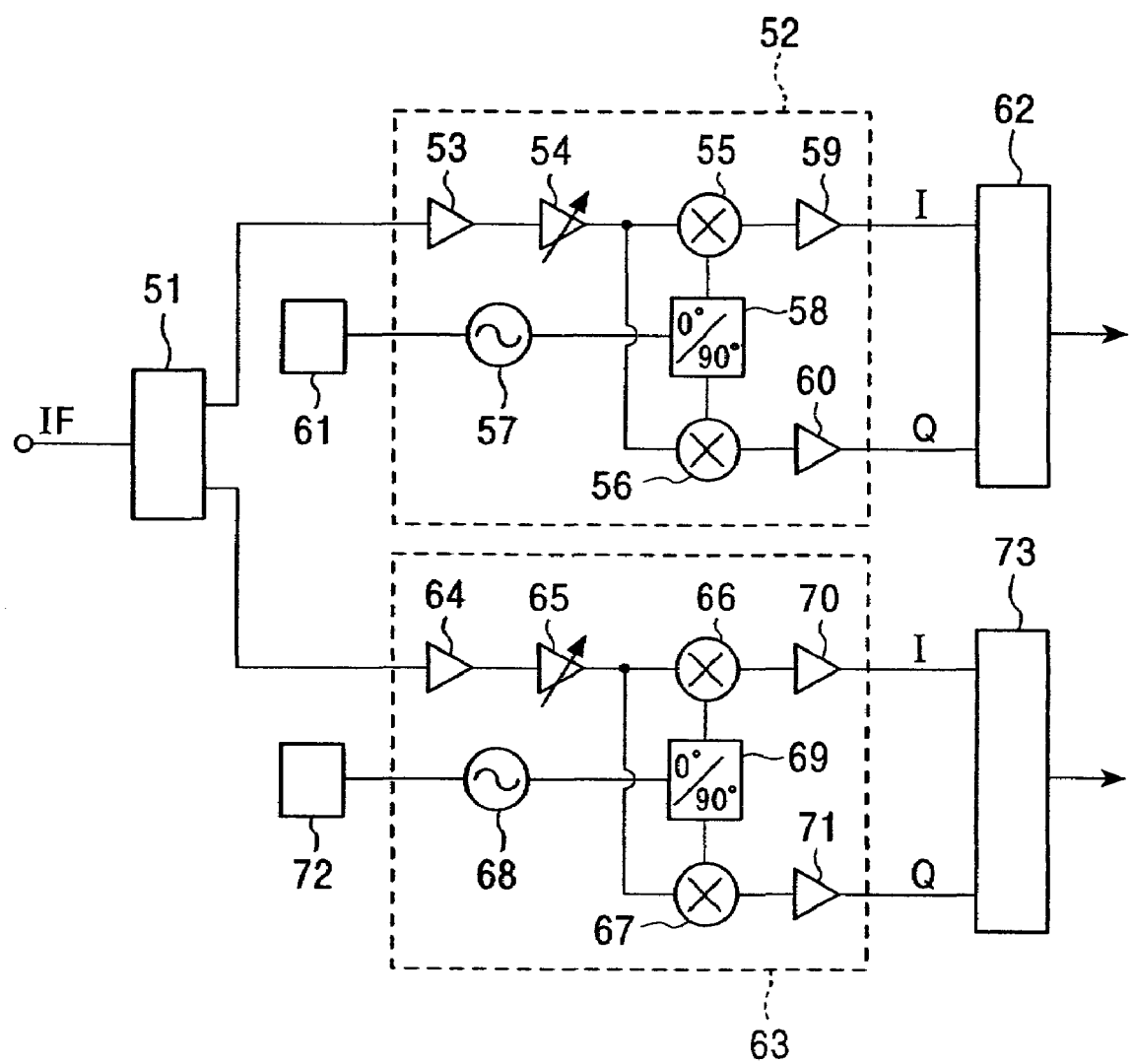
FIG. 4 is a circuit diagram showing the configuration of a known dual digital television tuner.

For example, a first direct conversion circuit 20 shown in FIG. 3 can be used instead of the first direct conversion circuit 10 shown in FIG. 1. The configuration shown in FIG. 3 is the same as that of the direct conversion circuit 10 shown in FIG. 1 except that the direct conversion circuit 20 does not have the frequency divider 16. In this case, a first local oscillator 25 oscillates within the first frequency band A (i.e. the digital television intermediate-frequency signal of about 950 MHz to 2150 MHz) shown in FIG. 2. As a result, the oscillation frequency band of the first local oscillator 25 overlaps the oscillation frequency band of the second local oscillator 35 (C in FIG. 2, which is the range 475–1075 MHz) of the second direct conversion circuit 30 in a narrow range at a higher band (950–1075 MHz), as shown in FIG. 2. However, as long as the frequency bands do not appreciably overlap, the probability of overlap of the local oscillation signals is very low, and thus the above-described advantages can be achieved from a practical point of view. Appreciable overlap may be defined as an overlap of at most about 25% of the larger of the frequency ranges. In the examples shown in FIG. 2, the overlap of the A/B frequency range is (2150−1900)/(4300−1900)=about 10% for B and (2150−1900)/(2150−950)=about 20% for A, while the overlap of the A/C frequency range is (1075−950)/(1075−475) =about 20% for C and (1075−950)/(2150−950)=about 10% for A. Of course, the lower the overlap of ranges, the smaller the probability of direct interference of the two frequencies, however when the overlap is at most 25% of both of the frequency ranges, direct interference of the local oscillation signals can be efficiently suppressed, leading to an effective decrease in phase noise.

In this case, too, by adequately setting the multiplication factor M of the multiplier 36 of the second direct conversion circuit 30 (for example M=3) while the first direct conversion circuit 20 is used, the oscillation frequency band of the first local oscillator 25 does not overlap the oscillation frequency band of the second local oscillator 35.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. A dual digital television tuner comprising:
   first and second direct conversion circuits, each having a pair of mixers and a local oscillator, in which a digital television signal is input to the pair of mixers, which directly output baseband signals,
   wherein the first direct conversion circuit comprises one of a frequency divider and a multiplier,
   each of the pair of mixers, the local oscillator, the frequency divider, and the multiplier is constituted by a balanced circuit,
   an oscillation signal of the local oscillator in the first direct conversion circuit is input to the pair of mixers of the first direct conversion circuit through the frequency divider or the multiplier, and
   wherein the oscillation frequency band of the local oscillator in the first direct conversion circuit does not overlap the oscillation frequency band of the local oscillator in the second direct conversion circuit.

2. The dual digital television tuner according to claim 1, wherein the first direct conversion circuit and the second direct conversion circuit are integrated.

3. A dual digital television tuner comprising:
   first and second direct conversion circuits, each having a pair of mixers and a local oscillator, in which a digital television signal is input to the pair of mixers, which directly output baseband signals,
   wherein the first direct conversion circuit comprises a frequency divider and the second direct conversion circuit comprises a multiplier,
   each of the pair of mixers, the local oscillator, the frequency divider, and the multiplier is constituted by a balanced circuit, and
   an oscillation signal of the local oscillator in the first direct conversion circuit is input to the pair of mixers of the first direct conversion circuit through the frequency divider, and an oscillation signal of the local oscillator in the second direct conversion circuit is input to the pair of mixers of the second direct conversion circuit through the multiplier.

4. A dual digital television tuner comprising:
   a first direct conversion circuit; and
   a second direct conversion circuit,
   each of the first and second direct conversion circuits including:
   an intermediate-frequency amplifier having an input to which a separated intermediate-frequency signal is provided and which supplies an amplified intermediate-frequency signal from an output,
   a variable gain amplifier to amplify the amplified intermediate-frequency signal and provide a variably-amplified signal, the variable gain amplifier controlled by an automatic gain control (AGO) voltage,
   a local oscillator that provides an oscillation signal within a range of frequencies,
   a phase shifter that divides a signal dependent on the oscillation signal and having a frequency of between about 950 MHz and about 2150 MHz into a first phase shifted signal and a second phase shifted signal, the first phase shifted signal and second phase shifted signal orthogonal to each other,
   a pair of mixers that mix one of the first and second phase shifted signals and the variably-amplified signal, the phase shifted signal mixed by one of the mixers having a different phase from the phase shifted signal mixed by the other of the mixers, baseband signals being provided from an output of the mixers, and
   a pair of baseband signal amplifiers that amplify the baseband signals,
   wherein at least one of the first and second direct conversion circuits contains a first frequency shifter that shifts the oscillation frequency of the local oscillator by a first factor, and
   a first range of frequencies provided by the local oscillator in the first direct conversion circuit and a second range of frequencies provided by the local oscillator in the second direct conversion circuit at most do not appreciably overlap.

5. A dual digital television tuner according to claim 4, wherein the first and second range of frequencies do not overlap.

6. A dual digital television tuner according to claim 5, wherein the first and second range of frequencies are separated by at least about 5% of the smaller frequency range of the first and second range of frequencies.

7. A dual digital television tuner according to claim 4, wherein the first and second range of frequencies overlap by at most about 25% of the larger of the first and second range of frequencies.

8. A dual digital television tuner according to claim 4, wherein the first factor is an integer.

9. A dual digital television tuner according to claim 4, wherein the first factor is a rational number.

10. A dual digital television tuner according to claim 4, wherein the first frequency shifter is a multiplier that multiplies the oscillation frequency of the local oscillator of the one of the first and second direct conversion circuits by the first factor.

11. A dual digital television tuner according to claim 4, wherein the first frequency shifter is a frequency divider that divides the oscillation frequency of the local oscillator of the one of the first and second direct conversion circuits by the first factor.

12. A dual digital television tuner according to claim 4, wherein each of each pair of mixers, each local oscillator and the first frequency shifter is constituted by a balanced circuit.

13. A dual digital television tuner according to claim 12, wherein each of each intermediate-frequency amplifier, each variable gain amplifier, each phase shifter, and each pair of baseband signal amplifiers is constituted by a balanced circuit.

14. A dual digital television tuner according to claim 4, further comprising a second frequency shifter, the first frequency shifter shifting the oscillation frequency of the local oscillator in the first direct conversion circuit by the first factor and the second frequency shifter shifting the oscillation frequency of the local oscillator in the second direct conversion circuit by a second factor.

15. A dual digital television tuner according to claim 14, wherein the first and second range of frequencies do not overlap.

16. A dual digital television tuner according to claim 15, wherein the first and second range of frequencies are separated by at least about 5% of the smaller frequency range of the first and second range of frequencies.

17. A dual digital television tuner according to claim 14, wherein at least one of the first and second factors is an integer.

18. A dual digital television tuner according to claim 14, wherein the first and second factors are rational numbers.

19. A dual digital television tuner according to claim 14, wherein the first and second factors are inverses of each other.

20. A dual digital television tuner according to claim 14, wherein the first and second factors are not inverses of each other.

21. A dual digital television tuner according to claim 14, wherein the first frequency shifter is a multiplier that multiplies the oscillation frequency of the local oscillator of the first direct conversion circuit by the first factor and the second frequency shifter is a frequency divider that divides the oscillation frequency of the local oscillator of the second direct conversion circuit by the second factor.

22. A dual digital television tuner according to claim 14, wherein each of each pair of mixers, each local oscillator and each frequency shifter is constituted by a balanced circuit.

23. A dual digital television tuner according to claim 19, wherein each of each intermediate-frequency amplifier, each variable gain amplifier, each phase shifter, and each pair of baseband signal amplifiers is constituted by a balanced circuit.

24. A method of decreasing phase noise in a dual digital television tuner comprising:
providing a first oscillation signal having a first frequency within a first range of frequencies and a second oscillation signal having a second frequency within a second range of frequencies, the first and second range of frequencies at most not appreciably overlapping;
frequency shifting at least one of the first and second oscillation signals thereby forming a first signal dependent on the first oscillation signal and a second signal dependent on the second oscillation signal;
dividing each of the first and second signals into a first phase shifted signal and a second phase shifted signal, the first and second phase shifted signals each having a frequency of between about 950 MHz and about 2150 MHz and being orthogonal to each other;
providing first and second baseband signals by mixing one of each of the first and second phase shifted signals and a variably-amplified intermediate-frequency input signal; and
amplifying the baseband signals.

25. A method according to claim 24, further comprising controlling a variable gain of the amplified intermediate-frequency signal.

26. A method according to claim 24, further comprising providing non-overlapping first and second range of frequencies.

27. A method according to claim 26, further comprising separating the first and second range of frequencies separated by at least about 5% of the smaller frequency range of the first and second range of frequencies.

28. A method according to claim 24, further comprising selecting first and second range of frequencies that overlap by at most about 25% of the larger of the first and second range of frequencies.

29. A method according to claim 24, wherein the frequency shifting comprises frequency shifting the at least one of the first and second oscillation signals by an integer.

30. A method according to claim 24, wherein the frequency shifting comprises frequency shifting the at least one of the first and second oscillation signals by a rational number.

31. A method according to claim 24, wherein the frequency shifting comprises multiplying the at least one of the first and second oscillation signals.

32. A method according to claim 24, wherein the frequency shifting comprises dividing the at least one of the first and second oscillation signals.

33. A method according to claim 24, further comprising suppressing radiation of each of the first and second oscillation signals by constructing each circuit element that: provides the first and second oscillation signals, frequency shifts the at least one of the first and second oscillation signals, divides the first and second signals into the first and second phase shifted signals, provides the first and second baseband signals and amplifies the baseband signals from balanced circuit.

34. A method according to claim 24, wherein the frequency shifting comprises frequency shifting both the first and second oscillation signals.

35. A method according to claim 34, further comprising providing non-overlapping first and second range of frequencies.

36. A method according to claim 35, further comprising separating the first and second range of frequencies separated by at least about 5% of the smaller frequency range of the first and second range of frequencies.

37. A method according to claim 34, wherein the frequency shifting comprises frequency shifting at least one of the first and second oscillation signals by an integer.

38. A method according to claim 34, wherein the frequency shifting comprises frequency shifting the first and second oscillation signals by rational numbers.

39. A method according to claim 34, wherein the frequency shifting comprises frequency shifting the first and second oscillation signals by inverses of each other.

40. A method according to claim 34, wherein the frequency shifting comprises frequency shifting the first and second oscillation signals by numbers that are not inverses of each other.

41. A method according to claim 34, wherein the frequency shifting comprises multiplying the first oscillation signal and dividing the second oscillation signal.

42. A method according to claim 34, further comprising suppressing radiation of each of the first and second oscillation signals by constructing each circuit element that: provides the first and second oscillation signals, frequency shifts the first and second oscillation signals, divides the first and second signals into the first and second phase shifted signals, provides the first and second baseband signals and amplifies the baseband signals from balanced circuit.

* * * * *

UNITED STATES PATENT AND TRADEMARK OFFICE
CERTIFICATE OF CORRECTION

PATENT NO. : 7,002,639 B2 Page 1 of 1
APPLICATION NO. : 10/108592
DATED : February 21, 2006
INVENTOR(S) : Satoshi Kawai It is certified that error appears in the above-identified patent and that said Letters Patent is hereby corrected as shown below:

In the Claims

Column 7, in claim 4, line 13, delete "(AGQ)" and substitute --(AGC)-- in its place.

Signed and Sealed this

Twelfth Day of December, 2006

JON W. DUDAS
*Director of the United States Patent and Trademark Office*